US 6,529,408 B2

(12) United States Patent
Uchihashi

(10) Patent No.: US 6,529,408 B2
(45) Date of Patent: Mar. 4, 2003

(54) SEMICONDUCTOR STORAGE DEVICE AND METHOD FOR EVALUATING THE SAME

(75) Inventor: Masanori Uchihashi, Tenri (JP)

(73) Assignee: Sharp Kabushiki Kaisha (JP)

( * ) Notice: Subject to any disclaimer, the term of this patent is extended or adjusted under 35 U.S.C. 154(b) by 0 days.

(21) Appl. No.: 09/903,136

(22) Filed: Jul. 10, 2001

(65) Prior Publication Data
US 2002/0003729 A1 Jan. 10, 2002

(30) Foreign Application Priority Data
Jul. 10, 2000 (JP) ........................................ 2000-209122

(51) Int. Cl.[7] .............................................. G11C 14/00
(52) U.S. Cl. ................ 365/185.08; 365/233; 365/233.5
(58) Field of Search ....................... 365/185.08, 185.33, 365/230.08, 233, 233.5

(56) References Cited

U.S. PATENT DOCUMENTS 5,677,885 A 10/1997 Roohparvar
5,721,703 A 2/1998 Habersetzer et al.
6,005,810 A * 12/1999 Wu ........................ 365/185.08
6,201,733 B1 * 3/2001 Hiraki et al. .......... 365/185.08

FOREIGN PATENT DOCUMENTS

| DE | 198 39 570 A1 | 5/1999 |
| EP | 0 929 075 A1 | 7/1999 |
| JP | 11-176166 | 2/1999 |

* cited by examiner

Primary Examiner—David Lam
(74) Attorney, Agent, or Firm—Morrison & Foerster LLP

(57) ABSTRACT

A semiconductor storage device comprising a rewritable non-volatile semiconductor memory and a volatile semiconductor memory, the non-volatile semiconductor memory including: a memory area for storing timing information for adjusting a timing of an internal operation of the volatile semiconductor memory; and an output circuit for outputting the timing information stored in the memory area to the volatile semiconductor memory, wherein the volatile semiconductor memory adjusts the timing of the internal operation of the volatile semiconductor memory based on the timing information.

11 Claims, 12 Drawing Sheets

*"Related Art"*

FIG. 13

SEMICONDUCTOR STORAGE DEVICE AND METHOD FOR EVALUATING THE SAME

CROSS-REFERENCE TO RELATED APPLICATIONS

This application claims priority to Japanese Patent Application Number 2000-209122 filed Jul. 10, 2000, the content of which is incorporated herein by reference in its entirety.

BACKGROUND OF THE INVENTION

1. Field of the Invention

The present invention relates to a semiconductor storage device and a method for evaluating the same. Specifically, the present invention relates to a semiconductor storage device where a deviation of an internal timing for reading data, which results from a variation of characteristics of elements constituting the semiconductor storage device during a fabrication process thereof, can be eliminated after the fabrication process is completed so that an optimum internal timing is obtained, and to a method for evaluating such a semiconductor storage device. Furthermore, the present invention relates to a semiconductor storage device whose specification can be changed after the fabrication thereof is completed so as to provide various types of products (e.g., a product having an 8-bit input/output terminal or a product having a 16-bit input/output terminal), and to a method for evaluating such a semiconductor storage device. Especially, the present invention relates to a semiconductor storage device which is preferably used in the case where semiconductor storage devices based on different supply voltage specifications (e.g., 5 V and 3.3 V) are produced from a same chip design, and to a method for evaluating such a semiconductor storage device.

2. Description of the Related Art

In the semiconductor storage device industry, for the purpose of satisfying various needs of customers, manufacturers supply a line of semiconductor storage devices which have the same storage capacity but different specifications, e.g., the supply voltage for operation (operation supply voltage), the operation speed, the bit width at which data can be input/output at one time, etc. However, even if various types of semiconductor storage devices are produced based on different specifications, these semiconductor storage devices generally have a common circuit configuration, because it is inefficient to design a circuit of a semiconductor storage device in order to realize an optimum configuration for each product type. In order to provide adjustment to various specifications without deteriorating the production efficiency, semiconductor storage devices having a common circuit configuration are fabricated, and means for changing specifications in accordance with necessity is provided to the semiconductor storage devices.

Conventionally, specifications are altered by changing the bonding arrangement or by disconnecting a trimming fuse. Furthermore, using such known methods, a deviation of a specification value from a desired designed value (desired specification value), which results from variation of characteristics caused during a fabrication process, is corrected in a conventional technique.

Change in specifications as to a function of a semiconductor storage device, e.g., the bit width at which data can be input/output at one time, etc., is performed using a logical method which is achieved by switching control circuits related to the function. However, change in specifications regarding performance of a semiconductor storage device, e.g., the operation supply voltage, the operation speed, etc., and correction of a deviation from a desired specification value, require timing adjustments of a synchronization signal for an internal operation of the semiconductor storage device.

A typical synchronization signal used in semiconductor storage devices is an address transition detector (ATD) pulse signal. This signal is a pulse signal generated in response to an externally-supplied address signal, or the like, and used for synchronization of an internal operation. In synchronization with this ATD pulse signal, circuits insides a semiconductor storage device are operated, whereby a high speed operation is achieved. The ATD pulse signal is generated by a synchronization signal generation circuit (hereinafter, "ATD pulse generation circuit") in response to an externally-supplied address signal, or the like.

For example, in the case where a semiconductor storage device arranged for use with a 3.3 V supply voltage and a semiconductor storage device arranged for use with a 5 V supply voltage are produced based on a same chip design, if the ATD pulse signal is optimized for a 3.3 V supply voltage specification, the operation speed of the semiconductor storage device is decreased when operated at the supply voltage of 5 V. On the other hand, if the ATD pulse signal is optimized for a 5 V supply voltage specification, the semiconductor storage device does not operate at the supply voltage of 3.3 V. This is because the pulse width of the ATD pulse signal optimized for a 3.3 V supply voltage specification differs from the pulse width of the ATD pulse signal optimized for a 5 V supply voltage specification.

In order to address such problems, in general, the bonding arrangement is changed or the trimming fuse is disconnected, whereby the pulse width of the ATD pulse signal is adjusted such that the semiconductor storage device operates at the supply voltage of 3.3 V.

Figure 13:
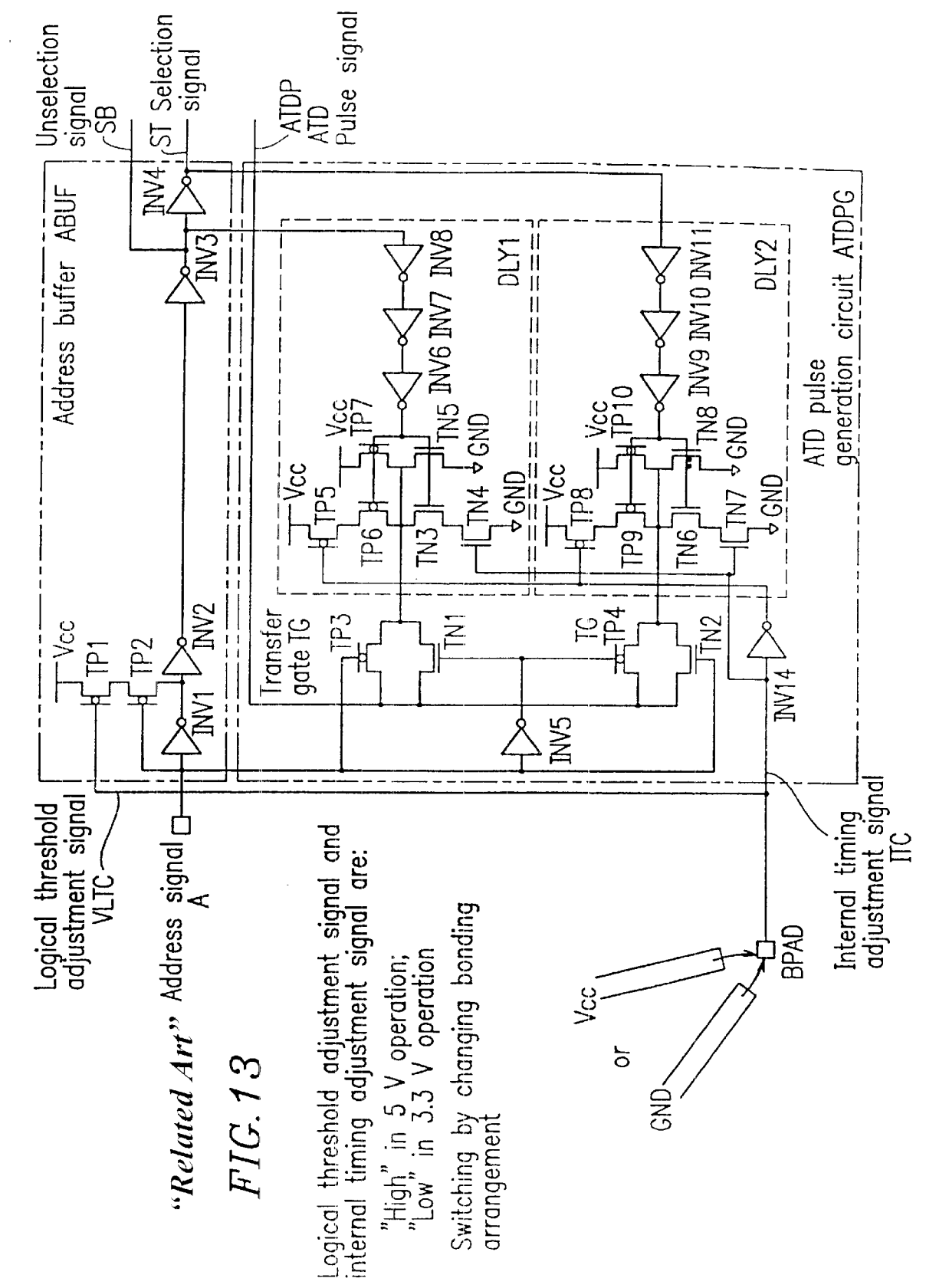

FIGS. 12 and 13 each show an example of an address input buffer ABUF and an ATD pulse generation circuit ATDPG inside a Static Random Access Memory (SRAM), which is a volatile semiconductor memory, in a conventional semiconductor storage device.

In the semiconductor storage device shown in FIG. 12, the pulse width of the ATD pulse signal is adjusted by utilizing a trimming fuse. Specifically, the potential of an inverter INV13 which connects to an internal timing adjustment signal ITC and a logical threshold adjustment signal VLTC is changed based on whether or not the trimming fuse is disconnected by a laser beam, whereby the pulse width of the ATD pulse signal is adjusted. When the supply voltage is 5 V, in order to make the logical threshold adjustment signal VLTC and the internal timing adjustment signal ITC be at a high level, the trimming fuse is not disconnected so that the potential input to the inverter INV12 is equal to the supply potential Vcc. When the supply voltage is 3.3 V, in order to make the logical threshold adjustment signal VLTC and the internal timing adjustment signal ITC be at a low level, the trimming fuse is disconnected by a laser beam so that the potential input to the inverter INV12 is equal to the ground potential GND.

In the semiconductor storage device shown in FIG. 13, the pulse width of the ATD pulse signal is adjusted by changing the bonding arrangement. Specifically, the internal timing adjustment signal ITC and the logical threshold adjustment signal VLTC which control an internal timing of the semiconductor storage device are connected to a bonding pad BPAD. The potential of the bonding pad BPAD is determined by whether the bonding pad BPAD is connected to a power line of a lead frame (i.e., the supply potential Vcc) or a ground line of the lead frame (i.e., ground potential GND), whereby the pulse width of the ATD pulse signal is adjusted. When the supply voltage is 5 V, in order to make the logical threshold adjustment signal VLTC and the internal timing adjustment signal ITC be at a high level, the bonding pad BPAD is connected to the power line Vcc. When the supply voltage is 3.3 V, in order to make the logical threshold adjustment signal VLTC and the internal timing adjustment signal ITC be at a low level, the bonding pad BPAD is connected to the ground line GND. An example of such a method for adjusting the pulse width of the ATD pulse signal by changing the bonding arrangement is disclosed in Japanese Laid-Open Publication No. 11-176166.

Next, steps for such an adjustment and change of a specification which are achieved by utilizing a trimming fuse are specifically described below.

In general, a semiconductor storage device includes: electric circuits on a semiconductor substrate, such as transistors, resistors, capacitors, and the like; interconnections which connect such electric circuits to one another; trimming fuses used for changing a circuit configuration after the above circuits and interconnections have been formed, etc.

The semiconductor storage device having such a structure is generally fabricated by successively performing respective steps for forming transistors, interconnections, etc. After all of circuits in the semiconductor storage device have been fabricated, at the final step, specification values of transistors and functions of the semiconductor storage device, such as an operation speed and the like, are measured. If a measured specification value is different from a predetermined (desired) specification value due to variation of characteristics of elements constituting the semiconductor storage device which occurred during the fabrication process, a trimming fuse is disconnected by a laser beam at the final step of the fabrication process, whereby a function such as a reading speed for reading data from a memory of the semiconductor storage device can be adjusted. Furthermore, in a similar manner, another trimming fuse is disconnected by a laser beam in the final step so as to change a circuit configuration, whereby the semiconductor storage device can be specifically arranged so as to be a product based on an 8-bit input/output terminal or a product based on an 16-bit input/output terminal. Furthermore, in the final step of the fabrication process, an appropriate trimming fuse is disconnected by a laser beam so as to change the circuit configuration such that the semiconductor storage device operates in synchronization with an optimum internal timing, whereby the semiconductor storage device can be specifically arranged so as to suitably operate at a specific supply voltage specification, e.g., a 5 V supply voltage specification or a 3.3 V supply voltage specification.

Next, steps for such an adjustment and change of a specification which are achieved by changing the bonding arrangement are specifically described below.

In general, a fabrication process of a semiconductor storage device includes: in the first half of the process, steps for forming electric circuits, such as transistors, resistors, capacitors, and the like, on a semiconductor substrate, and for forming interconnections which connect such electric circuits to one another; and in the second half of the process, steps for connecting these electric circuits and interconnections to external electric elements and for packaging the semiconductor storage device with a resin so as to protect the semiconductor storage device from a physical environment, such as pressure, moisture, etc.

In the second half of the fabrication process, at a step for connecting the semiconductor storage device to an external electric element, the semiconductor storage device is selectively connected (bonded) to an appropriate external connection terminal with a gold wire or the like, whereby the same effect as that achieved by disconnecting a trimming fuse by a laser beam so as to change a circuit configuration can be obtained.

As described above, in a conventional semiconductor storage device having an address buffer and an ATD pulse generation circuit, selection of the supply voltage is determined, for example, between 5 V and 3.3 V, at a bonding step or fuse disconnection step. Thus, this selection cannot be changed after the semiconductor storage device has been packaged.

The step for disconnecting a trimming fuse by a laser beam is carried out during the fabrication process of the semiconductor storage device. Since the semiconductor storage device is coated with a resin or the like in the second half of the fabrication process, a trimming fuse cannot be disconnected after the coating step is completed. Furthermore, similarly, the wire bonding arrangement cannot be changed after the semiconductor storage device has been fabricated because the semiconductor storage device is coated with a resin or the like.

Thus, if a customer changes his/her mind so as to buy semiconductor storage devices arranged for use at a supply voltage of 3.3 V after semiconductor storage devices arranged for use at a supply voltage of 5 V have been fabricated, a manufacturer must carry out the fabrication process from the first step so as to fabricate a fresh set of semiconductor storage devices arranged for use at a supply voltage of 3.3 V. Furthermore, even if a malfunction due to a variation of characteristics of elements constituting the semiconductor storage device which may occur during the fabrication process is detected in a test carried out after the packaging step, there is no way to eliminate such a malfunction. Further still, even if a terminal for achieving a function equivalent to a change of the bonding arrangement or disconnection of a trimming fuse is provided so as to extend outside the package for the purpose of eliminating such a malfunction, a resulting terminal configuration of the semiconductor storage device differs from those of conventional, widely-used semiconductor storage devices. Thus, the customer needs to additionally use a special system for such semiconductor storage devices having extra terminals. Such a semiconductor storage device having an extra terminal outside the package is difficult to handle as compared with widely-used semiconductor storage devices.

SUMMARY OF THE INVENTION

According to one aspect of the present invention, a semiconductor storage device includes a rewritable non-volatile semiconductor memory and a volatile semiconductor memory, the non-volatile semiconductor memory including: a memory area for storing timing information for adjusting a timing of an internal operation of the volatile semiconductor memory; and an output circuit for outputting the timing information stored in the memory area to the volatile semiconductor memory, wherein the volatile semiconductor memory adjusts the timing of the internal operation of the volatile semiconductor memory based on the timing information.

In one embodiment of the present invention, the volatile semiconductor memory includes a synchronization signal generation circuit for generating a synchronization signal based on the timing information; and the volatile semiconductor memory operates in synchronization with the synchronization signal.

According to another aspect of the present invention, a semiconductor storage device includes a rewritable non-volatile semiconductor memory and a volatile semiconductor memory, the non-volatile semiconductor memory including: a memory area for storing specification information for specifying a specification of the volatile semiconductor memory; and an output circuit for outputting the specification information stored in the memory area to the volatile semiconductor memory, wherein the volatile semiconductor memory changes the specification of the volatile semiconductor memory based on the specification information.

In one embodiment of the present invention, the non-volatile semiconductor memory further includes another memory area for storing timing information for adjusting a timing of an internal operation of the volatile semiconductor memory; the output circuit outputs the timing information stored in the another memory area to the volatile semiconductor memory; and the volatile semiconductor memory adjusts the timing of the internal operation of the volatile semiconductor memory based on the timing information.

In another embodiment of the present invention, the volatile semiconductor memory includes a synchronization signal generation circuit for generating a synchronization signal based on the timing information; and the volatile semiconductor memory operates in synchronization with the synchronization signal.

In still another embodiment of the present invention, the specification of the volatile semiconductor memory includes a specification as to a bit width of data to be read out from the volatile semiconductor memory.

In still another embodiment of the present invention, the specification of the volatile semiconductor memory includes a specification as to an operating voltage for operating the volatile semiconductor memory.

In still another embodiment of the present invention, the volatile semiconductor memory controls, based on the specification information, an amount of delay in a read timing signal for reading data from the volatile semiconductor memory.

According to still another aspect of the present invention, there is provided a method for evaluating a semiconductor storage device comprising a rewritable non-volatile semiconductor memory and a volatile semiconductor memory, wherein: the non-volatile semiconductor memory and the volatile semiconductor memory are enclosed in a same package; the non-volatile semiconductor memory includes a memory area for storing timing information for adjusting a timing of an internal operation of the volatile semiconductor memory, and an output circuit for outputting the timing information stored in the memory area to the volatile semiconductor memory; and the volatile semiconductor memory adjusts the timing of the internal operation of the volatile semiconductor memory based on the timing information; and the method for evaluating a semiconductor storage device includes steps of evaluating a characteristic of the volatile semiconductor memory, writing the timing information in the memory area, and reevaluating the characteristic of the volatile semiconductor memory.

According to still another aspect of the present invention, there is provided a method for evaluating a semiconductor storage device comprising a rewritable non-volatile semiconductor memory and a volatile semiconductor memory, wherein: the non-volatile semiconductor memory and the volatile semiconductor memory are enclosed in a same package; the non-volatile semiconductor memory includes a memory area for storing specification information for specifying a specification of the volatile semiconductor memory, and an output circuit for outputting the specification information stored in the memory area to the volatile semiconductor memory; and the volatile semiconductor memory changes the specification of the volatile semiconductor memory based on the specification information; and the method for evaluating a semiconductor storage device includes steps of evaluating a characteristic of the volatile semiconductor memory, writing the specification information in the memory area, and reevaluating the characteristic of the volatile semiconductor memory.

In one embodiment of the present invention, wherein: the non-volatile semiconductor memory further includes another memory area for storing timing information for adjusting a timing of an internal operation of the volatile semiconductor memory; and the method for evaluating a semiconductor storage device further includes a step of writing the timing information in the another memory area.

Hereinafter, a function of the present invention is described.

A semiconductor storage device according to the present invention includes a non-volatile semiconductor memory, such as a FLASH EEPROM, and a volatile semiconductor memory, such as an SRAM. The non-volatile semiconductor memory includes: a memory area for storing timing information used for adjusting the internal timing of the semiconductor storage device or information used for changing a specification of the semiconductor storage device; a control circuit for writing information in the memory area (for example, in an example illustrated in FIG. 3, a voltage control circuit, a write control circuit, and the like); and an output circuit for outputting information stored in the memory area (for example, in the example illustrated in FIG. 3, a logic circuit including inverters 12 and 13). The volatile semiconductor memory (SRAM) adjusts an ATD pulse signal generated by a synchronization signal generation circuit (ATD pulse generation circuit) and changes specifications of the SRAM based on the information stored in the memory area of the non-volatile semiconductor memory.

For example, according to the present invention, in semiconductor storage devices arranged for use at 5 V supply voltage specification and 3.3 V supply voltage specification, a memory area for storing information used for switching a specification and a logic circuit are added in the FLASH EEPROM, and a synchronization signal generation circuit for generating the ATD pulse signal based on the information (signal) stored in the memory area is provided in the SRAM, in place of changing of the bonding arrangement or disconnection of a trimming fuse, for the purpose of adjusting a signal which is activated only when the semiconductor storage device operates at the 3.3 V supply voltage.

According to the above semiconductor storage device, a volatile semiconductor memory, such as an SRAM, etc., and a rewritable non-volatile semiconductor memory, such as a FLASH EEPROM, etc., are enclosed in a same package and connected to each other by means of bonding or the like. Thus, writing a signal in the above memory area during or after fabrication of the semiconductor storage device can achieve an effect same as that achieved by disconnection of a fuse or switching of the bonding arrangement. Thus, a malfunction of a device which is caused when a line of device products based on different specifications are produced from a single circuit configuration, or which is caused due to a variation in characteristics of elements constituting the device which occurs during the fabrication process, is eliminated by an adjustment step provided in the first or second half of the fabrication process or provided after the fabrication process, whereby characteristics of the semiconductor storage device can be improved.

Furthermore, a stock step in the manufacturing (production adjustment) can be performed after the fabrication process is completed. As a result, the number of products which may be disposed of as defective products in the first and second half of the fabrication process can be reduced. Furthermore, there is no possibility that an unsuccessful disconnection of a trimming fuse by a laser beam is caused. Similarly, an unsuccessful bonding in a bonding step can be avoided. Further still, an adjustment step can be performed after a step for evaluating characteristics. Thus, fabrication of products for sale can be started at an earlier stage in the entire manufacturing process, and accordingly, a period required for experimental production and a period required for evaluation of a product can be shortened.

In the case where various types of devices are produced from a same chip design, if a deviation of the internal timing of the device is expected before fabrication, a pulse width adjustment signal may be associated with a signal for changing the device type (specification), whereby concurrently with the switching of the device type, the pulse width can be adjusted so as to be optimum for a selected device type. Furthermore, even after the quantity of production has been increased, it is possible to quickly satisfy demands of customers because a stock step for products is performed only for finished products after the fabrication process has been completed.

Thus, according to the present invention, adjustment for a deviation of a word line selection signal and a deviation of a sense amplifier enable signal from the internal timing which result from variation of characteristics caused during the fabrication process, change of various functional specifications (e.g., between a product having 8-bit input/output terminal and a product having 16-bit input/output terminal), and change in the supply voltage specification (e.g., between a 5 V specification and a 3.3 V specification), all of which can be achieved before a packaging step has been completed in a conventional semiconductor storage device, can be achieved even after the packaging step has been completed. Furthermore, such adjustment and change in specifications can be achieved only inside the semiconductor storage device, and accordingly, the configuration of terminals of the device is the same as those of conventional, widely-used semiconductor storage devices. Therefore, customers need not change a conventional system design. Further still, a conventional, widely-used non-volatile semiconductor memory such as a FLASH EEPROM has a terminal for introducing an internal timing adjustment control signal and an internal timing adjustment write signal into the FLASH EEPROM, and therefore, it is not necessary for the semiconductor storage device of the present invention to provide additional terminal therefor.

Thus, the invention described herein makes possible the advantages of (1) providing a semiconductor storage device having a configuration of terminals which is the same as those of conventional, widely-used semiconductor storage devices where, after the fabrication process of the semiconductor storage device is completed, specifications for functions or specifications for performance can be changed, and a deviation of the internal timing of the semiconductor storage device which results from a variation of characteristics caused during a fabrication process thereof can be eliminated; and (2) providing a method for evaluating such a semiconductor storage device.

These and other advantages of the present invention will become apparent to those skilled in the art upon reading and understanding the following detailed description with reference to the accompanying figures.

BRIEF DESCRIPTION OF THE DRAWINGS

FIGS. 12 and 13 each show an example of an address input buffer ABUF and an ATD pulse generation circuit ATDPG in an SRAM, which is a volatile semiconductor memory, in a conventional semiconductor storage device.

DESCRIPTION OF THE PREFERRED EMBODIMENTS

Hereinafter, an embodiment of the present invention will be described with reference to the drawings.

Figure 1:
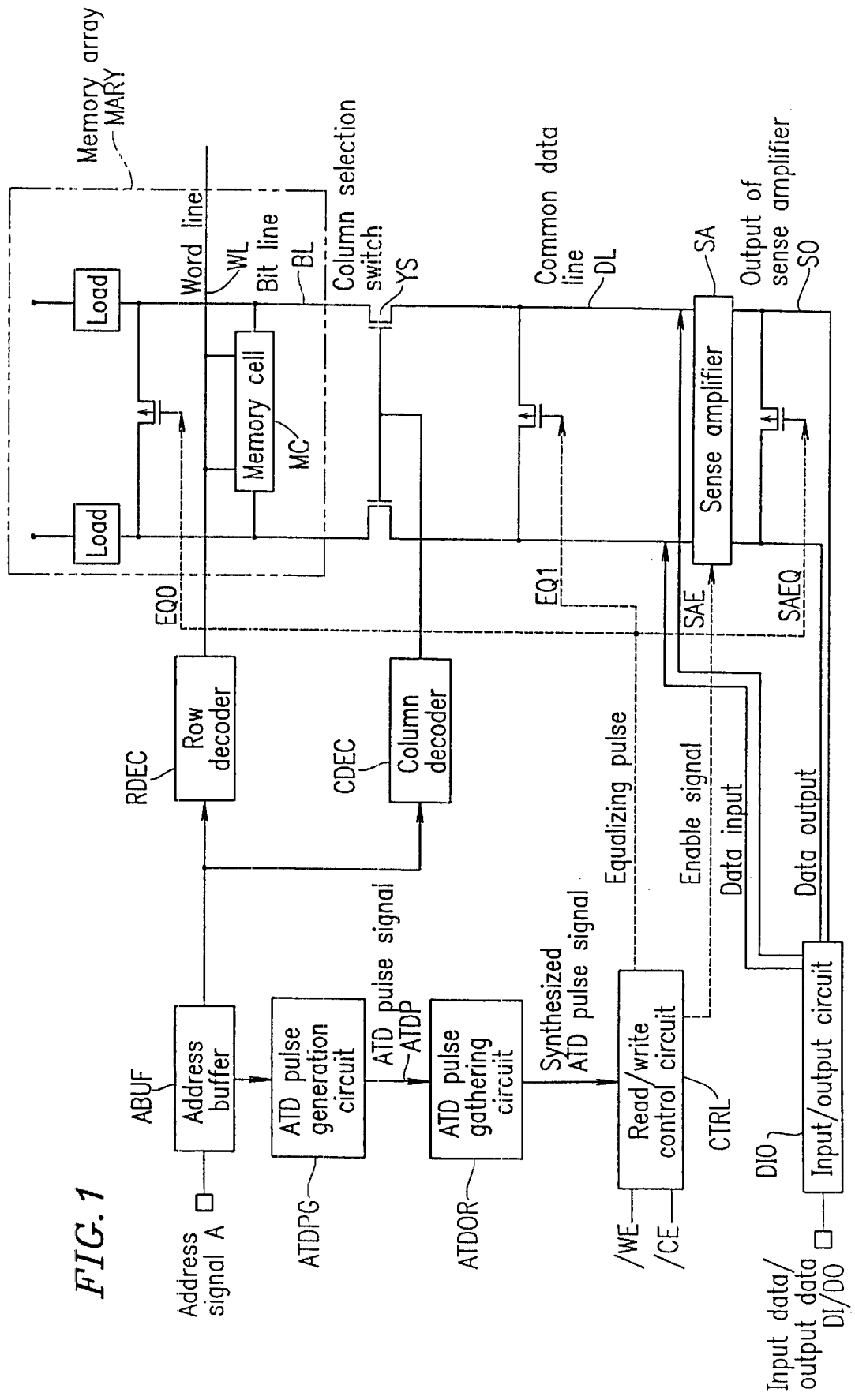
FIG. 1 is a block diagram showing a volatile semiconductor memory portion included in a semiconductor storage device according to an embodiment of the present invention.
Figure 2:
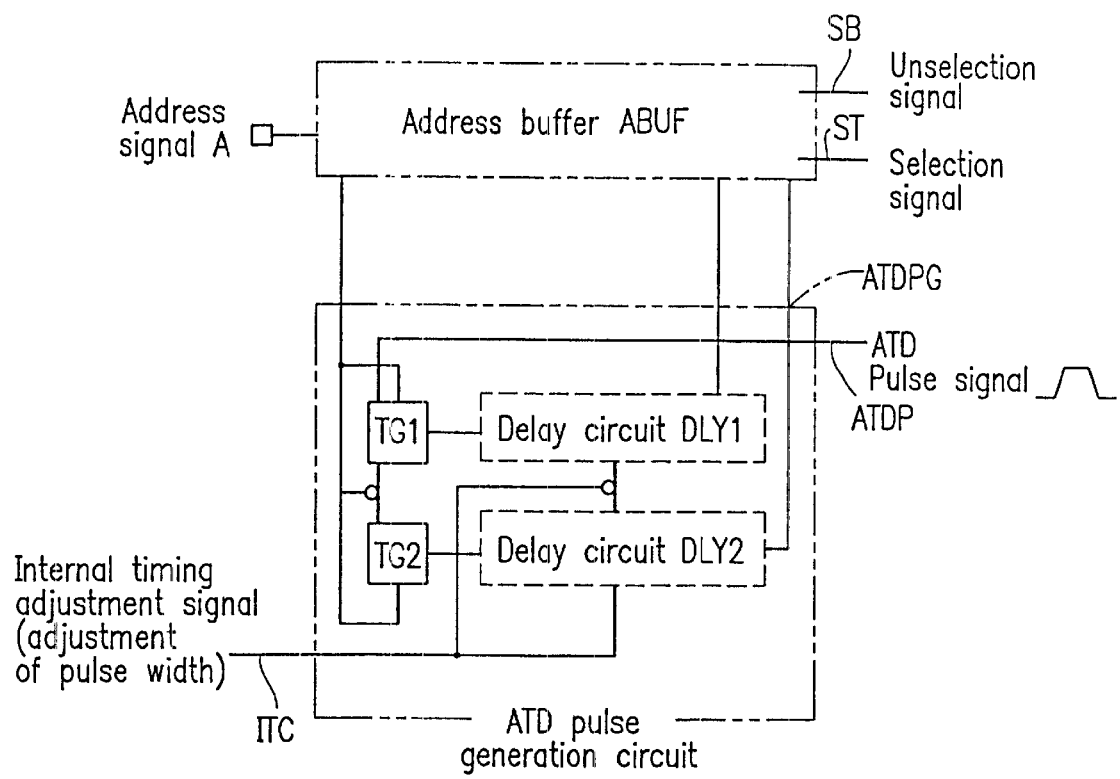
FIG. 2 is a block diagram showing a structure of an ATD pulse generation circuit in the semiconductor storage device according to the embodiment of the present invention.
Figure 3:
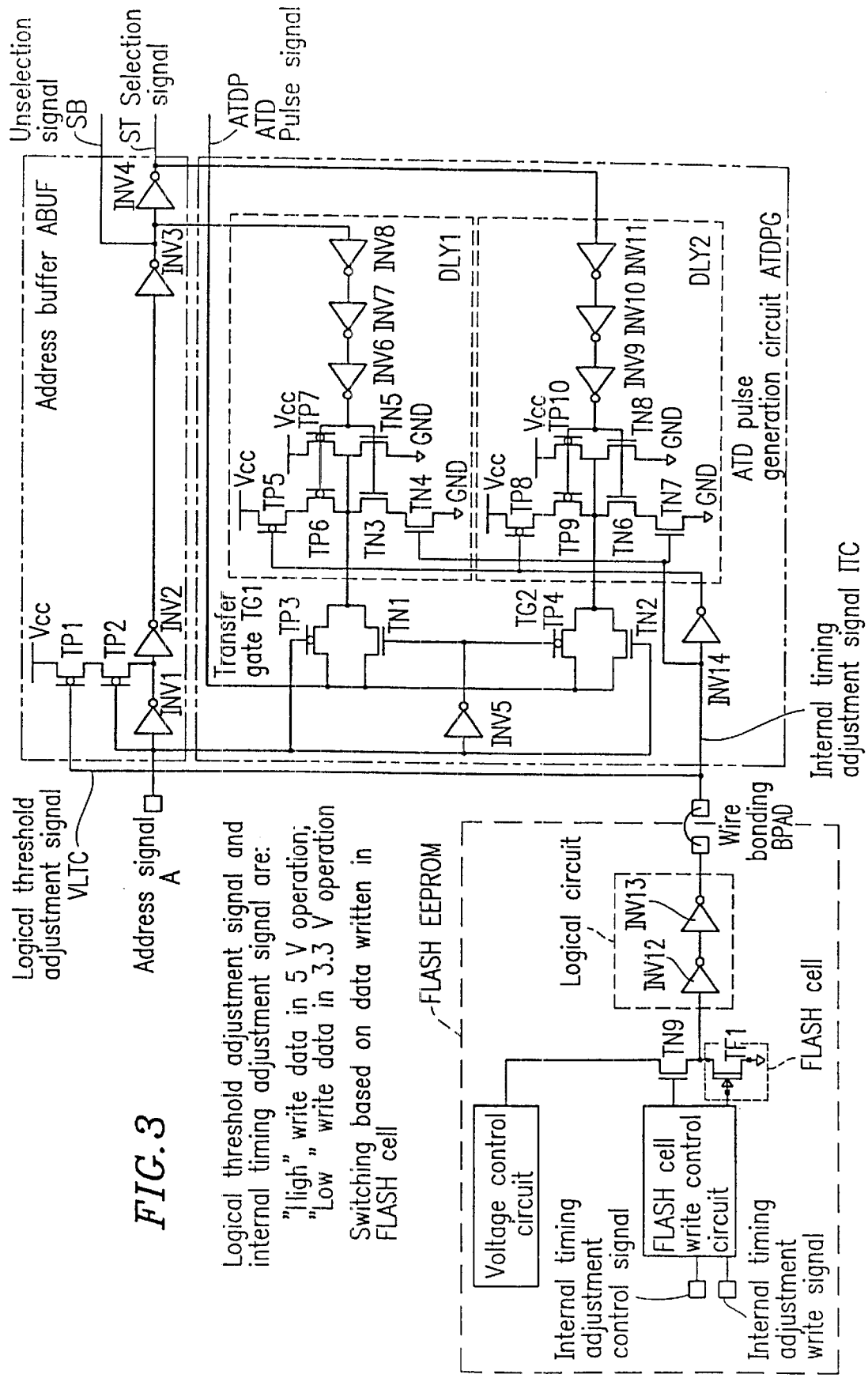
FIG. 3 shows an exemplary structure of an address buffer and the ATD pulse generation circuit, which are provided in an SRAM, and a circuit for storing internal timing adjustment information, which is provided in a FLASH EEPROM of the semiconductor storage device according to this embodiment.
Figure 4:
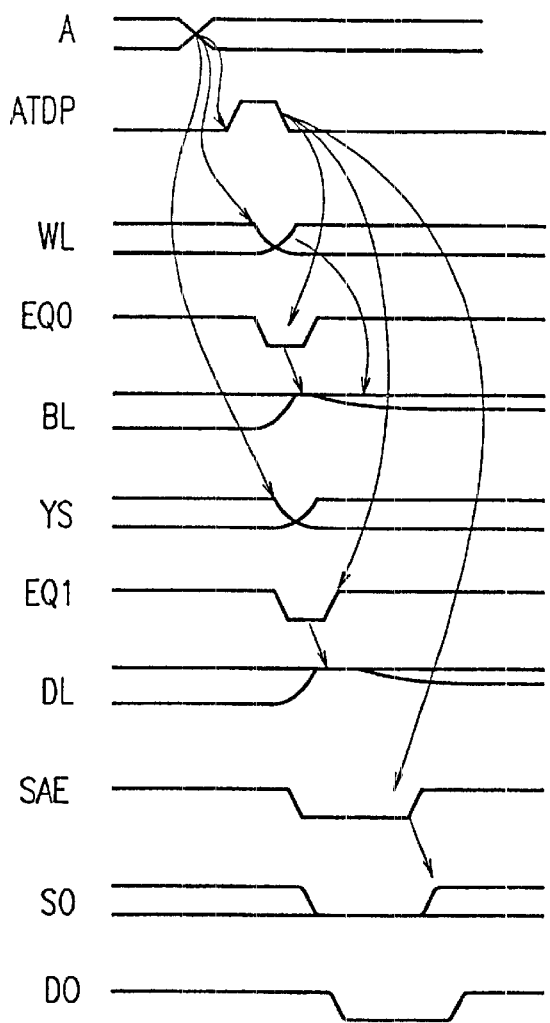
FIG. 4 is a timing chart for illustrating a read operation in the semiconductor storage device according to this embodiment.
Figure 5:
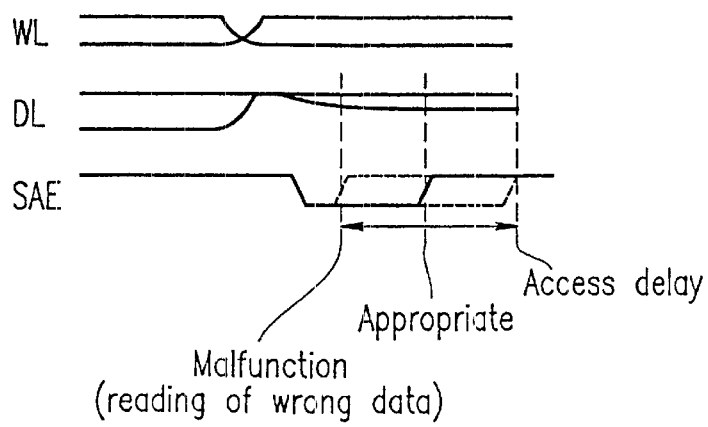
FIG. 5 is a timing chart which illustrates an effect produced by a change in pulse width of an ATD pulse signal.

FIG. 1 is a block diagram showing a volatile semiconductor memory portion included in a semiconductor storage device according to an embodiment of the present invention. FIG. 2 is a block diagram showing a structure of an ATD pulse generation circuit provided to the volatile semiconductor memory portion shown in FIG. 1. FIG. 3 shows an address buffer and the ATD pulse generation circuit (synchronization signal generation circuit), which are provided to the volatile semiconductor memory (in this example, an SRAM), and a circuit for storing internal timing adjustment information, which is provided to a non-volatile semiconductor memory (in this example, a FLASH EEPROM) of the semiconductor storage device according to this embodiment. FIG. 4 is a timing chart for illustrating a read operation in the semiconductor storage device according to this embodiment. FIG. 5 is a timing chart which illustrates an effect produced by a change in pulse width of the synchronization signal (hereinafter, "ATD pulse signal").

For example, the semiconductor storage device according to the present embodiment includes an SRAM of 1 M byte shown in FIG. 1. The SRAM of FIG. 1 includes: a memory array MARY formed by a plurality of memory cells MC provided at intersections at which word lines WL and bit lines BL (only one word line WL and one bit line BL are shown in FIG. 1) cross each other; a row decoder RDEC and a column decoder CDEC for selecting a designated one of the memory cells MC included in the memory array MARY; an address buffer ABUF for generating a row/column address signal in response to an address signal A; a sense amplifier SA for detecting and amplifying data to be output; an input/output circuit DIO for inputting/outputting the data; an ATD pulse generation circuit ATDPG for generating an ATD pulse signal; an ATD pulse gathering circuit ATDOR for gathering and synthesizing ATD pulse signals; and a read/write control circuit CTRL for generating an equalizing signal (equalizing pulse) or control signal.

In the SRAM, the address buffer ABUF externally receives an address signal A. Then, the address buffer ABUF generates a row address signal and a column address signal. The generated row address signal and column address signal are supplied to the row decoder RDEC and the column decoder CDEC, respectively, whereby one of the word lines WL and a column selection switch YS are activated so as to select a designated memory cell MC in the memory array MARY. When a write operation is performed, input data DI is supplied to the memory array MARY through the input/output circuit DIO. When a read operation is performed, output data DO is output from the memory array MARY through the sense amplifier SA and the input/output circuit DIO. The address signal A is supplied to the ATD pulse generation circuit ATDPG through the address buffer ABUF. The ATD pulse generation circuit ATDPG generates an ATD pulse signal ATDP based on the address signal A. The ATD pulse signal ATDP is supplied to the ATD pulse gathering circuit ATDOR to generate a synthesized ATD pulse signal. The synthesized ATD pulse signal is synthesized by the read/write control circuit CTRL with a chip enable signal /CE, a write enable signal /WE, etc., into a bit line equalizing signal EQ0, a common data line equalizing signal EQ1, a sense amplifier equalizing signal SAEQ, a sense amplifier enable signal SAE, etc. These signals are supplied to various internal circuits (e.g., the read/write control circuit CTRL, the row decoder RDEC, etc.) and used as an equalizing signal and a control signal for reading data from a memory cell.

According to this embodiment, as shown in FIG. 2, the ATD pulse generation circuit ATDPG is formed by delay circuits DLY1 and DLY2 and transfer gates TG. The address buffer ABUF supplies an address signal to the ATD pulse generation circuit ATDPG to adjust the ATD pulse signal so as to have a desired pulse width. Specifically, referring to FIG. 3, the operation mode of the delay circuits DLY1 and DLY2 are switched based on the internal timing adjustment signal ITC between a mode where only NMOS transistors TN5 and TN8 and PMOS transistors TP7 and TP10 are activated and a mode where NMOS transistors TN3 and TN6 and PMOS transistors TP6 and TP9 are activated in addition to the above transistors, whereby a desired pulse width is obtained.

As shown in FIG. 3, a non-volatile semiconductor memory (in this example, a FLASH EEPROM) is connected to a volatile semiconductor memory (in this example, an SRAM) by means of wire bonding.

With reference to FIG. 3, exemplary structures of the address buffer ABUF and the ATD pulse generation circuit ATDPG are now described. Herein, an example where the supply voltage is 5 V and an example where the supply voltage is 3.3 V are described.

The address buffer ABUF includes, for example, inverters INV1-INV4 and PMOS transistors TP1 and TP2. The address buffer ABUF externally receives an address signal A. The address signal A is branched by the address buffer ABUF into a selection signal ST and a non-selection signal SB. The selection signal ST and the non-selection signal SB are supplied to the row decoder RDEC and the column decoder CDEC. In particular, the selection signal ST is output through the serially-connected inverters INV1-INV4 whereas the non-selection signal SB is output through the serially-connected inverters INV1-INV3.

In the address buffer ABUF, the serially-connected PMOS transistors TP1 and TP2 are connected between a supply potential Vcc and a connection node between the inverters INV1 and INV2. Among the PMOS transistors TP1 and TP2, a transistor located closer to the supply potential Vcc (in this example, transistors TP1) receives a logical threshold adjustment signal VLTC at a gate thereof. Based on whether the voltage level of this adjustment signal VLTC is at a high level (5 V operation) or at a low level (3.3 V operation), the operation speed of the inverter INV1 is adjusted. For example, when the logical threshold adjustment signal VLTC is at a high level, the PMOS transistor TP1 is turned off. When the adjustment signal VLTC is at a low level, the PMOS transistor TP1 is turned on. Then, during a period when the PMOS transistor TP1 is on, if the address signal transits from a high level to a low level, the PMOS transistor TP2 is turned on, whereby an output of the inverter INV1 abruptly rises to a high level. Thus, the address buffer ABUF operates at a high speed when the logical threshold adjustment signal VLTC is at a low level rather than when the logical threshold adjustment signal VLTC is at a high level.

For example, the ATD pulse generation circuit ATDPG includes: the delay circuit DLY1 including inverters INV6-INV8, PMOS transistors TP5-TP7, and NMOS transistors TN3-TN5; the delay circuit DLY2 including inverters INV9-INV11, PMOS transistors TP8-TP10, and NMOS transistors TN6-TN8; an inverter INV14; and the transfer gate (switching circuit) TG1 formed by a PMOS transistor TP3, an NMOS transistor TN1, and an inverter INV5, and the transfer gate (switching circuit) TG2 formed by a PMOS transistor TP4, an NMOS transistor TN2, and the inverter INV5. The ATD pulse generation circuit ATDPG receives a signal from the address buffer ABUF. The signal is adjusted by the delay circuits DLY1 and DLY2 so as to have a desired pulse width which is then output as the ATD pulse signal ATDP.

The pulse width of the ATD pulse signal ATDP is controlled by the internal timing adjustment signal ITC input through an inverter INV14 to the PMOS transistors TP5 and TP8 included in the CMOS circuits at the final stages of the delay circuits DLY1 and DLY2, respectively, which are connected to the supply potential Vcc, and input to the NMOS transistors TN4 and TN7 included in the CMOS circuits at the final stages of the delay circuits DLY1 and DLY2, respectively, which are connected to the ground potential GND. The internal timing of the semiconductor storage device is controlled based on whether the voltage level of the internal timing adjustment signal ITC is at a high level (5 V operation) or at a low level (3.3 V operation).

For example, when the internal timing adjustment signal ITC is at a low level, the NMOS transistors TN4 and TN7 and the PMOS transistors TP5 and TP8 are turned off. As a result, the delay circuits DLY1 and DLY2 in the ATD pulse generation circuit ATDPG are driven only by the PMOS transistors TP7 and TP10 and the NMOS transistors TN5 and TN8. Alternatively, when the internal timing adjustment signal ITC is at a high level, the NMOS transistors TN4 and TN7 and the PMOS transistors TP5 and TP8 are turned on. As a result, the delay circuits DLY1 and DLY2 in the ATD pulse generation circuit ATDPG are driven by the PMOS transistors TP6 and TP9 and the NMOS transistors TN3 and TN6 in addition to the NMOS transistors TN4 and TN7 and the PMOS transistors TP5 and TP8 which have been turned on.

Thus, the pulse width of the ATD pulse signal ATDP becomes shorter when the internal timing adjustment signal ITC is at a high level rather than when the internal timing adjustment signal ITC is at a low level. The volatile semiconductor memory operates in synchronization with the ATD pulse signal ATDP generated in the above-described manner.

In the address buffer ABUF and the ATD pulse generation circuit ATDPG having the above structure, the voltage levels of logical threshold adjustment signal VLTC and the internal timing adjustment signal ITC are simultaneously switched based on a signal written in the FLASH EEPROM. For example, in order to pull these adjustment signals VLTC and ITC to a high level for a 5 V operation, a signal written in the FLASH EEPROM is pulled to a high level, whereby the FLASH EEPROM outputs the voltage level of the supply potential Vcc to the SRAM. Alternatively, in order to pull these adjustment signals VLTC and ITC to a low level for a 3.3 V operation, a signal written in the FLASH EEPROM is pulled to a low level, whereby the FLASH EEPROM outputs the voltage level of the ground potential GND to the SRAM.

Next, an exemplary structure of the FLASH EEPROM is described with reference to FIG. 3. The FLASH EEPROM includes: a logic circuit (output circuit) for outputting the logical threshold adjustment signal VLTC and the internal timing adjustment signal ITC to the SRAM; a memory area for retaining timing information necessary for switching the internal timing of the semiconductor storage device (hereinafter, referred to as "FLASH cell area"; in this example, the "FLASH cell area" is a FLASH cell TF1 of 1 bit); a write control circuit for controlling a writing of data in the FLASH cell area; and a voltage control circuit for providing the voltage written in the FLASH cell area. The voltage from the voltage control circuit is supplied to the FLASH cell TF1 through an N channel transistor TN9. Information in the FLASH cell area is output to the outside through the inverters INV12 and INV13 and a bonding pad BPAD.

In the FLASH cell TF1, the information necessary for switching the internal timing is written based on two control signals, i.e., an internal timing adjustment control signal and an internal timing adjustment write signal. This timing information is information obtained as a result of a test carried out solely for the SRAM included in the semiconductor storage device (e.g., access time, etc.). The writing of this information into the FLASH cell TF1 is performed by a tester under the control of the above two control signals. The test result can be input through the same terminal of the FLASH EEPROM for inputting the internal timing adjustment control signal or the internal timing adjustment write signal.

For example, when the supply voltage is 5 V, a signal at a high level is written in the FLASH cell TF1. When the supply voltage is 3.3 V, a signal at a low level is written in the FLASH cell TF1. Based on this data written in the FLASH cell TF1, the logical threshold adjustment signal VLTC and the internal timing adjustment signal ITC, which are output from the logic circuit, are adjusted so as to have a high or low voltage level.

In the above example, the change of supply voltage is described. In the case where the semiconductor storage device is arranged such that other specifications, such as the bit width at which data can be input in/output from the volatile semiconductor memory at one time, etc., can be changed, it is only necessary to provide another FLASH cell for storing specification information which specifies the specification of the volatile semiconductor memory. Thus, the volatile semiconductor memory can change its own specification based on the specification information stored in the non-volatile semiconductor memory. Furthermore, when specification information (signal) necessary for changing the supply voltage is different from timing information (signal) for adjusting the internal timing according to the information necessary for changing the supply voltage, FLASH cells may be separately provided to these information. In the case where a plurality of FLASH cells are provided, it is necessary to provide as many wire bonding pads BPAD as there are FLASH cells.

Figure 9:
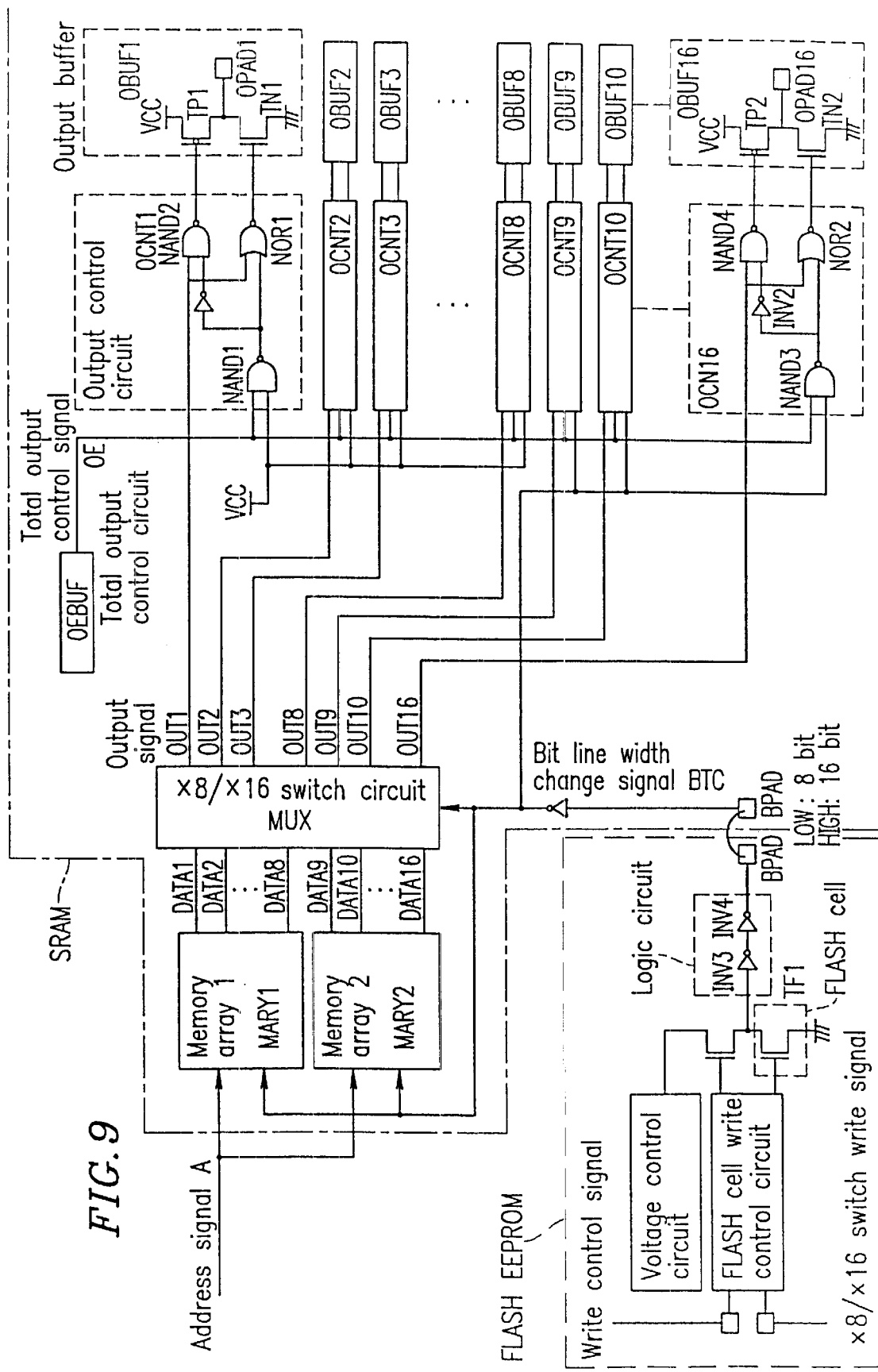
FIG. 9 illustrates a change of the bit width at which data can be input/output at one time in the semiconductor storage device according to the present embodiment.

Hereinafter, change of the bit width at which data can be input in/output from the volatile semiconductor memory at one time is described with reference to FIG. 9. In the example illustrated in FIG. 9, an output of the FLASH cell TF1 is input as a bit line width change signal BTC to a volatile semiconductor memory through inverters INV3 and INV4 and a bonding pad BPAD. For example, the bit width is switched between 8 bits and 16 bits. When the bit width is set to 8 bits, a signal at a low level is written in the FLASH cell TF1 based on a write control signal and a ×8/×16 switch write signal. When the bit width is set to 16 bits, a signal at a high level is written in the FLASH cell TF1 based on the write control signal and the ×8/×16 switch write signal. When the signal at a low level is written in the FLASH cell TF1, a bit line width change signal BTC becomes low. When the signal at a high level is written in the FLASH cell TF1, a bit line width change signal BTC becomes high.

An operation of the semiconductor storage device when the bit width is set to 8 bits is described. The bit line width change signal BTC is input to memory arrays MARY1 and MARY2. Based on the address signal A, one of these memory arrays MARY1 and MARY2 is selected. From the selected memory array, data signals DATA1-DATA8 or data signals DATA9-DATA16 are read out. The read signals (data) are transmitted to a ×8/×16 switch circuit MUX. Regardless of whether the data supplied to the ×8/×16 switch circuit MUX is the data signals DATA1-DATA8 or the data signals DATA9-DATA16, the ×8/×16 switch circuit MUX outputs output signals OUT1-OUT8.

For example, when the address signal A designates the memory array MARY1, the data signals DATA1-DATA8 are supplied to the ×8/×16 switch circuit MUX, which in turn outputs the output signals OUT1-OUT8. In the meantime, the data signals DATA9-DATA16 are not output, and thus, the ×8/×16 switch circuit MUX does not output the output signals OUT9-OUT16. Alternatively, when the address signal A designates the memory array MARY2, the data signals DATA9-DATA16 are supplied to the ×8/×16 switch circuit MUX, which in turn outputs the output signals OUT1-OUT8. In the meantime, the data signals DATA1-DATA8 are not output, and thus, the ×8/×16 switch circuit MUX does not output the output signals OUT9-OUT16.

Output control circuits OCNT1-OCNT8 receive the output signals OUT1-OUT8, respectively. When a total output control signal OE which is output from a total output control circuit OEBUF is at a high level, output buffers OBUF1-OBUF8 operate so as to supply output signals to output pads OPAD1-OPAD8, respectively.

For example, when the output signal OUT1 is at a low level, an output of a NAND circuit NAND2 becomes high, whereby a P-type transistor TP1 of the output buffer OBUF1 is turned off. In the meantime, an output of a NOR circuit NOR1 becomes high, whereby a N-type transistor TN1 of the output buffer OBUF1 is turned on. As a result, a signal at a low level is supplied to the output pad OPAD1. Alternatively, when the output signal OUT1 is at a high level, an output of a NAND circuit NAND2 becomes low, whereby a P-type transistor TP1 of the output buffer OBUF1 is turned on. In the meantime, an output of a NOR circuit NOR1 becomes low, whereby a N-type transistor TN1 of the output buffer OBUF1 is turned off. As a result, a signal at a high level is supplied to the output pad OPAD1.

On the other hand, a NAND circuit NAND3 in each of the output control circuits OCNT9-OCNT16 receives a low signal from the bit line width change signal BTC. Accordingly, an output of a NAND circuit NAND4 becomes high, whereby a P-type transistor TP2 for outputting read data is turned off. Similarly, a N-type transistor TN2 is also turned off. As a result, an output pad OPAD16 is thrust into a high impedance state and the volatile semiconductor memory works based on the bit width of 8 bits.

An operation of the semiconductor storage device when the bit width is set to 16 bits is described. When the bit width is set to 16 bits, a high signal is written in the FLASH cell TF1. Accordingly, the bit line width change signal BTC becomes high.

The bit line width change signal BTC at a high level is input to memory arrays MARY1 and MARY2. In this case, both of the memory arrays MARY1 and MARY2 are selected regardless of the address signal A. From these memory arrays, the data signals DATA1-DATA8 and the data signals DATA9-DATA16 are supplied to the ×8/×16 switch circuit MUX. Then, the ×8/×16 switch circuit MUX outputs output signals OUT1-OUT16.

The output control circuits OCNT1-OCNT16 receive the output signals OUT1-OUT16, respectively. When the total output control signal OE which is output from the total output control circuit OEBUF is at a high level, the output buffers OBUF1-OBUF16 operate so as to supply output signals to output pads OPAD1-OPAD16, respectively.

For example, when the output signal OUT1 is at a low level, an output of a NAND circuit NAND2 becomes high, whereby a P-type transistor TP1 of the output buffer OBUF1 is turned off. In the meantime, an output of a NOR circuit NOR1 becomes high, whereby a N-type transistor TN1 of the output buffer OBUF1 is turned on. As a result, a signal at a low level is supplied to the output pad OPAD1. Alternatively, when the output signal OUT1 is at a high level, an output of a NAND circuit NAND2 becomes low, whereby a P-type transistor TP1 of the output buffer OBUF1 is turned on. In the meantime, an output of a NOR circuit NOR1 becomes low, whereby a N-type transistor TN1 of the output buffer OBUF1 is turned off. As a result, a signal at a high level is supplied to the output pad OPAD1.

Thus, a high signal is written in the FLASH cell TF1, and accordingly, the bit line width change signal BTC becomes high, whereby the bit width is set to 16 bits. Alternatively, a low signal is written in the FLASH cell TF1, and accordingly, the bit line width change signal BTC becomes low, whereby the bit width is set to 8 bits.

According to the present invention, when the bit width is changed, another FLASH cell (not shown) for adjusting the internal timing of the SRAM may be provided in the non-volatile semiconductor memory in order to generate an ATD pulse signal ATDP which has been adjusted so as to be synchronized with the internal timing of the semiconductor storage device.

Next, correction of a deviation of a specification value from a predetermined (desired) value which results from a variation of characteristics during fabrication is described with reference to FIGS. 10 and 11. For example, in the case where the speed for reading data (reading speed) is decreased due to variation of characteristics caused during fabrication, a signal for activating a sense amplifier SA (sense amplifier enable signal SAE) is input in the sense amplifier SA as quickly as possible within a range where the semiconductor storage device can operate, whereby a high-speed memory can be achieved.

Figure 10:
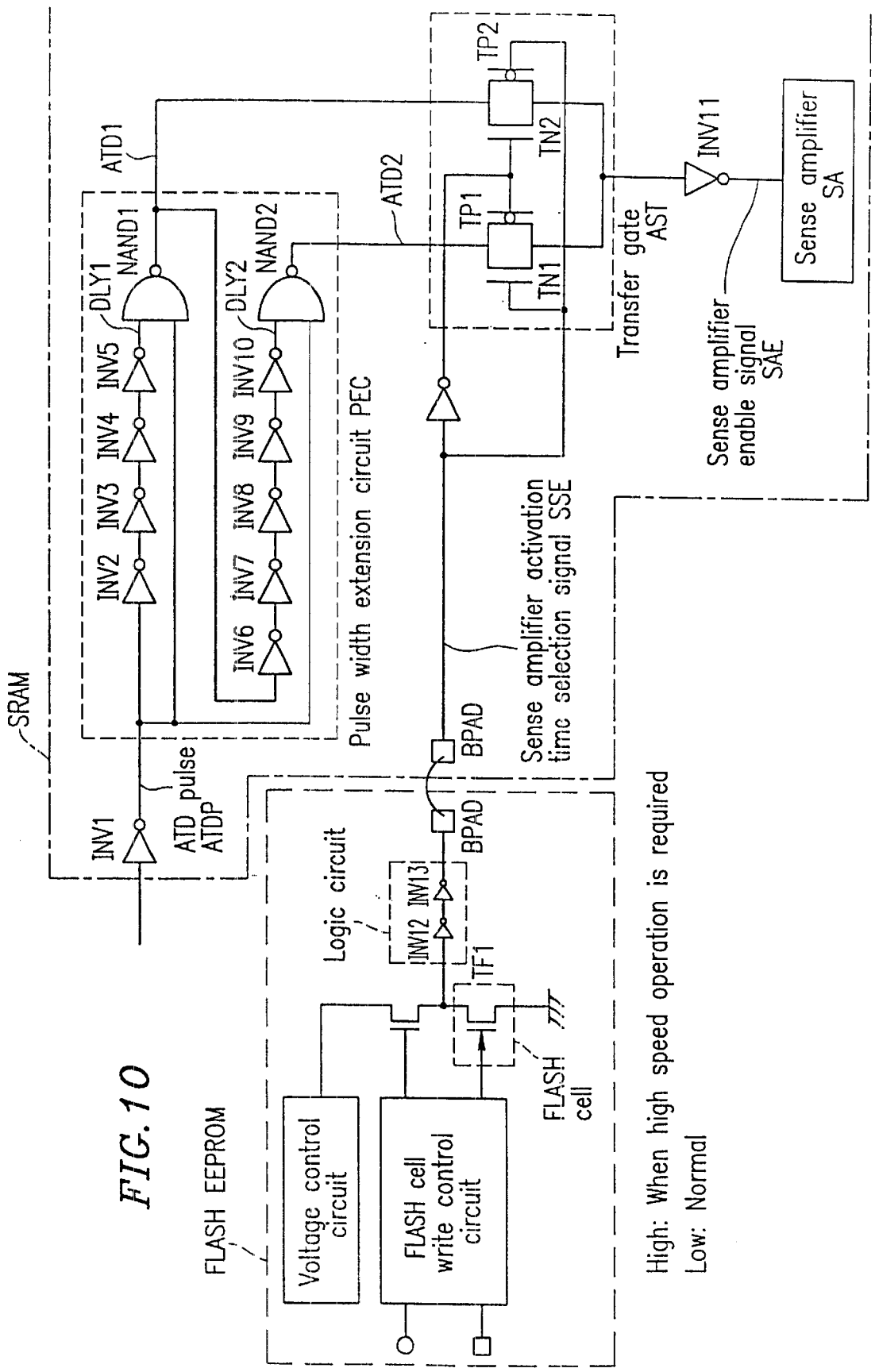
FIG. 10 illustrates a correction of a deviation of a specification value from a predetermined specification value which results from a variation of characteristics caused during a fabrication process of the semiconductor storage device according to the present embodiment.
Figure 11A:
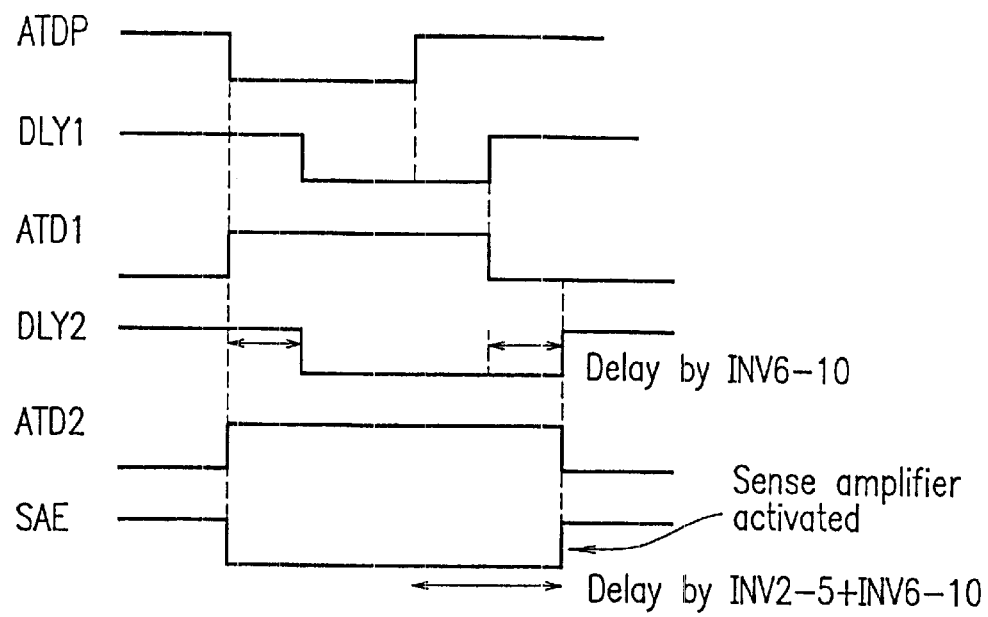
FIGS. 11A and 11B are timing charts for correcting a deviation of a specification value from a predetermined specification value which results from a variation of characteristics caused during a fabrication process of the semiconductor storage device according to the present embodiment.
Figure 11B:
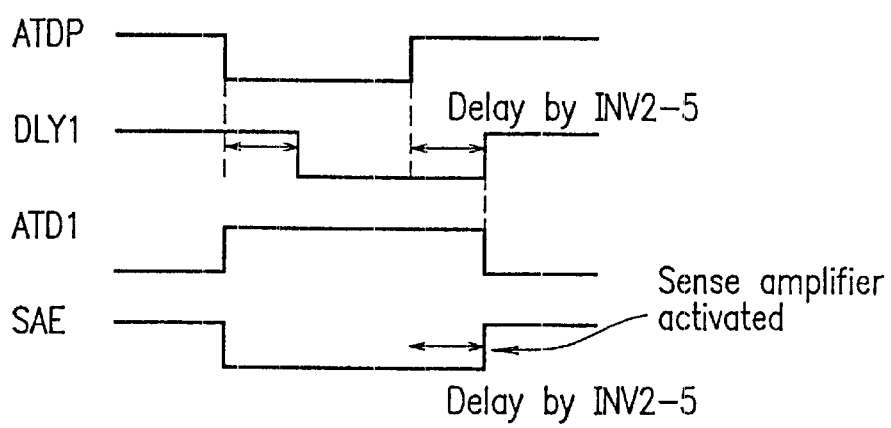
Figure 12:
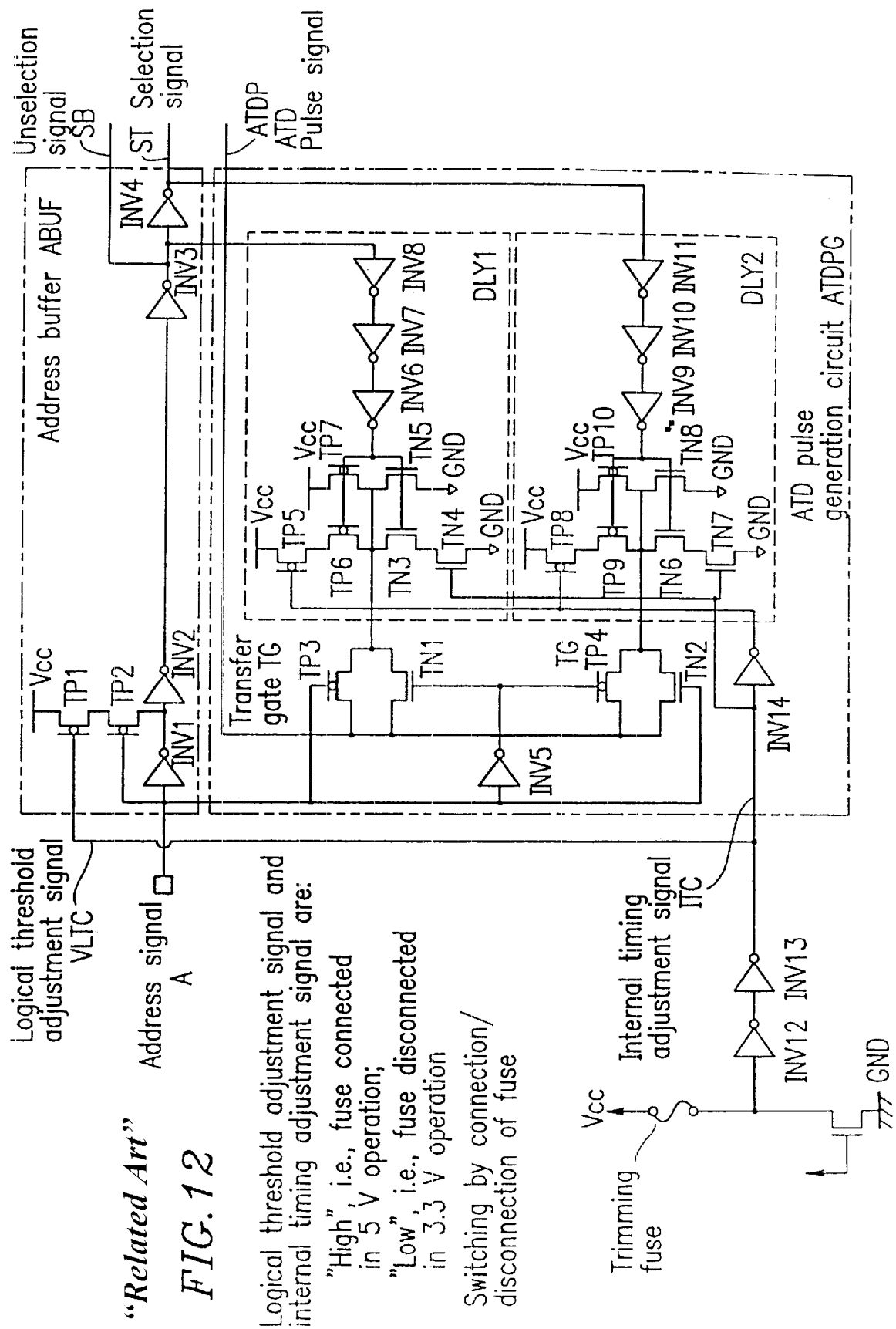

Herein, referring to FIG. 10, an output of the FLASH cell TF1 is input as a sense amplifier activation time selection signal SSE in the volatile semiconductor memory through the bonding pad BPAD. In general, in order to obtain as many non-defective articles as possible, a low signal is written in the FLASH cell TF1 (FIG. 10), whereby the timing for activating the sense amplifier SA is delayed. However, when the reading speed does not reach a predetermined (desired) specification value due to a variation of characteristics which is caused during fabrication, a high signal is written in the FLASH cell TF1, whereby the timing for activating the sense amplifier SA is adjusted. As a result, the reading speed is modified so as to be within an allowable range of the predetermined (desired) specification value.

Specifically, when a low signal is written in the FLASH cell TF1, the sense amplifier activation time selection signal SSE rises to a high level, whereby a N-type transistor TN1 and a P-type transistor TP1 of a transfer gate AST are turned on while a N-type transistor TN2 and a P-type transistor TP2 of the transfer gate AST are turned off. On the other hand, the transfer gate AST receives an ATD pulse signal ATD2 (FIG. 11A) having a sufficient delay caused by inverters INV2-INV10 of the delay circuits DLY1 and DLY2 (FIG. 10). The transfer gate AST outputs the sufficiently-delayed signal to the inverter INV11, which in turn inverts the sufficiently-delayed signal. The inverted, sufficiently-delayed signal is supplied as a sense amplifier enable signal SAE to the sense amplifier SA.

Alternatively, when a high signal is written in the FLASH cell TF1, the sense amplifier activation time selection signal SSE falls to a low level, whereby a N-type transistor TN1 and a P-type transistor TP1 of the transfer gate AST are turned off while a N-type transistor TN2 and a P-type transistor TP2 of the transfer gate AST are turned on. On the other hand, the transfer gate AST receives an ATD pulse signal ATD1 (FIG. 11B) having a slight delay caused by the inverters INV2-INV5 of the delay circuit DLY1 (FIG. 10). The transfer gate AST outputs the slightly-delayed signal to the inverter INV11, which in turn inverts the slightly-delayed signal. The inverted, slightly-delayed signal is supplied as a sense amplifier enable signal SAE to the sense amplifier SA.

Thus, if the reading speed is decreased due to variation of characteristics caused during fabrication, a high signal is written in the FLASH cell TF1, whereby the reading speed is increased as compared with a case where a low signal is written in the FLASH cell TF1. This is because the sense amplifier enable signal SAE can be input in the sense amplifier SA as quickly as possible by the time required for the ATD pulse signal to pass through the inverters INV6-INV10, whereby the reading speed can be set to a predetermined (desired) specification value.

According to the present invention, another FLASH cell (not shown) for adjusting the internal timing of the SRAM may be provided in the non-volatile semiconductor memory in order to provide an ATD pulse signal ATDP, which has been adjusted so as to be synchronized with the internal timing of the semiconductor storage device, to a pulse width extension circuit PEC shown in FIG. 10.

According to the present embodiment, in order to store necessary information, a memory area provided for adjusting the internal timing of the FLASH EEPROM itself is extended or a portion of the memory area is used for storing information which controls the SRAM. Furthermore, it is necessary to add a function for externally outputting such necessary information (signal) because a commonly-employed FLASH EEPROM does not have such an output function.

Next, reading of data from the SRAM in the semiconductor storage device having the above structure is described with reference to FIG. 4 in conjunction with FIG. 1.

In the first step, in synchronization with an activation of the address signal A input into the address buffer ABUF, a ATD pulse signal ATDP generated by the ATD pulse generation circuit ATDPG is pulled to a high level, and in the meantime, the word line WL and the column selection switch YS are activated so as to select a desired memory cell MC in the memory array MARY. Then, in synchronization with a transition of the ATD pulse signal ATDP to a low level, the bit line BL is activated by a bit line equalizing signal EQ0 generated by the read/write control circuit CTRL, and the common data line DL is activated by a common data line equalizing signal EQ1. In the meantime, in synchronization with a transition of the ATD pulse signal ATDP to a low level, the sense amplifier output SO is activated by the sense amplifier enable signal SAE generated by the read/write control circuit CTRL. As a result, data in the selected memory cell MC can be read out through the input/output circuit DIO.

Next, an effect produced by a change in pulse width of the ATD pulse signal is described with reference to FIG. 5.

In a read operation, after the word line WL and the bit line BL are activated, the sense amplifier enable signal SAE which determines the timing of the read operation is generated. The pulse width of the sense amplifier enable signal SAE gives an effect on data to be read. For example, in the case where semiconductor storage devices based on different operation voltages, e.g., 5 V and 3.3 V, are produced from the same chip design, if a physical environment varies during the fabrication process, the internal timing deviates from an optimum design value (desired specification value). When the resultant pulse width is narrower than an optimum pulse width, a malfunction occurs so that wrong data is read out. When the resultant pulse width is broader than the optimum pulse width, a delay is caused in the access time.

According to the present embodiment, a value to be written in the FLASH EEPROM is changed, whereby the voltage level of the internal timing adjustment signal ITC for adjusting the internal timing of the ATD pulse generation circuit ATDPG (FIG. 3) is pulled to a high or low level as well as the logical threshold adjustment signal VLTC which is used for adjusting the logical threshold value of the address buffer ABUF. In this way, the pulse width of the sense amplifier enable signal SAE can be changed such that the internal timing can be appropriately adjusted.

As described above, in the case where semiconductor storage devices based on different operation voltages, e.g., 5 V and 3.3 V, are produced from the same chip design, the pulse width of a signal for controlling the internal timing of the semiconductor storage device may be narrower or broader than an optimum pulse width, and as a result, the internal timing may deviate from a design value. However, according to the present invention, the pulse width can be appropriately adjusted in order to prevent the reading of wrong data, the delay in the access time, etc.

In the case where an enable signal or an equalizing signal are controlled by the ATD pulse signal ATDP, among the bit line BL, the common data line DL, the sense amplifier output SO, the input/output data bus, etc., a pair of lines having different potentials are short-circuited so as to have an equal potential, whereby the potentials of the short-circuited lines can be quickly inverted, i.e., the time required for inverting the potential can be reduced. For example, if a potential difference of 1 V is required, it is only necessary to set one of a pair of lines having the same potential of 3 V to 2 V. However, if a pair of a 2 V line and a 3 V line need to be changed to a pair of a 2 V line and a 1 V line, it is necessary to change the potential of the 3 V line to 1 V. Thus, when a pair of lines are processed so as to have a same potential, the time required for inverting the potential can be reduced as compared with a case where the potentials of a pair of lines having different potentials are changed such that the potential difference between the lines of the pair is inverted and has a desired potential difference value. Furthermore, the consumed current can be reduced by pulse-driving an internal operation circuit (e.g., ATD pulse generation circuit) for a required period. Still further, the operation margin of a product can be adjusted by adjusting the pulse width of the ATD pulse signal ATDP.

Thus, in a semiconductor storage device according to the present embodiment, the logical threshold adjustment signal VLTC which is used for adjusting the logical threshold value of the address buffer ABUF and the internal timing adjustment signal ITC for adjusting the internal timing of the ATD pulse generation circuit ATDPG are adjusted by adding a memory cell for storing a logical data to the FLASH EEPROM and changing data (signal) written in the memory cell, in place of disconnecting a trimming fuse or changing the bonding arrangement, whereby the logical threshold value of the inverter in the address buffer ABUF and the internal timing can be changed concurrently.

Next, steps for evaluating a semiconductor storage device of the present invention and changing a specification thereof are described with reference to FIGS. 7 and 8.

Figure 6:
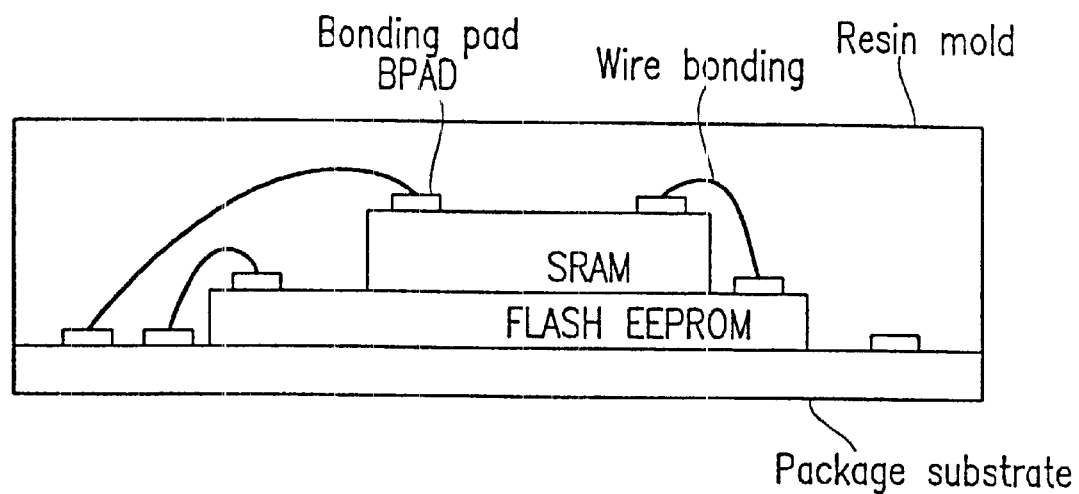
FIG. 6 is a cross-sectional view showing a packaged SRAM and FLASH EEPROM of the semiconductor storage device according to the present embodiment.
Figure 7:
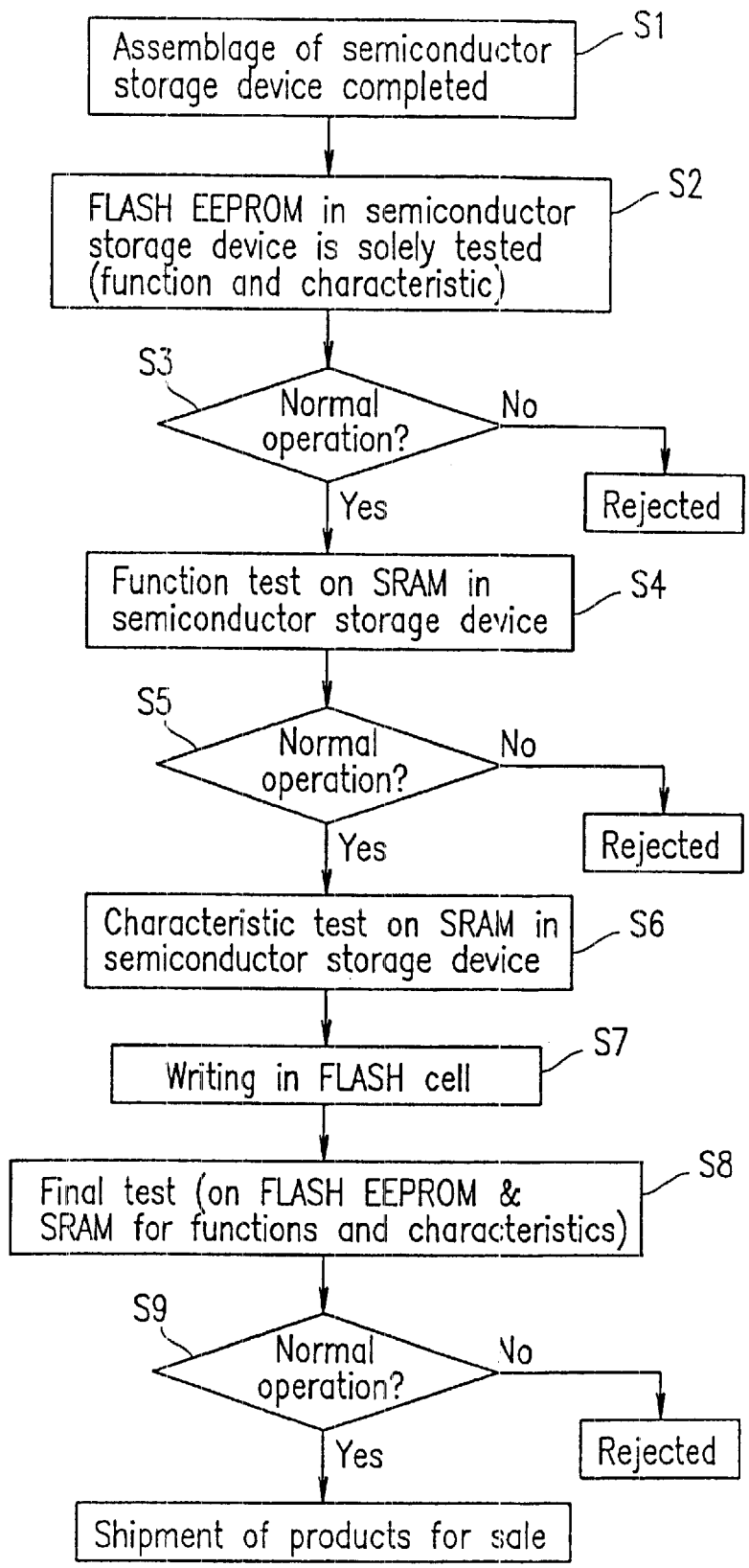
FIG. 7 is a flowchart of a process for evaluating the semiconductor storage device of the present embodiment and changing specifications thereof.
Figure 8:
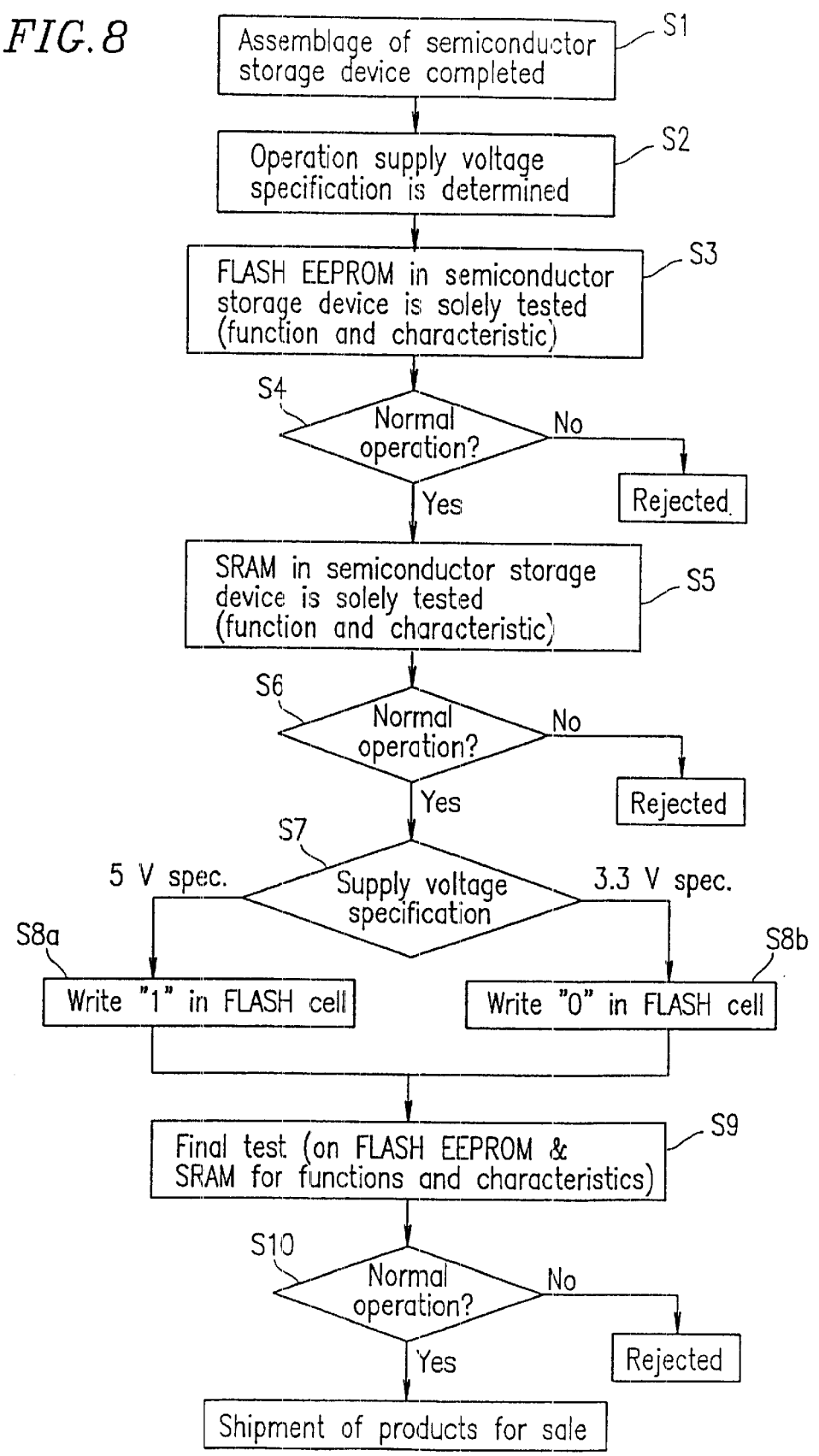
FIG. 8 is another flowchart of a process for evaluating the semiconductor storage device of the present embodiment and changing specifications thereof.

At step S1 of FIGS. 7 and 8, a semiconductor storage device having a structure shown in FIG. 6 is completed after FLASH EEPROMs and SRAMs in the form of a wafer have been tested and non-defective wafers have been selected. In general, a FLASH EEPROM and an SRAM are stacked such that a memory of smaller size is placed over a memory of larger size. In the example illustrated in FIG. 6, the FLASH EEPROM is placed over a package substrate, and the SRAM is placed over the FLASH EEPROM. The FLASH EEPROM and the SRAM are connected through bonding pads BPAD, and a resultant structure is packaged with a resin mold.

In general, according to the present embodiment, evaluation of a semiconductor storage device having such a structure, and change of a specification of the semiconductor storage device can be achieved through a process shown in FIG. 7. At step S1, assemblage of the semiconductor storage devices are completed. At step S2, the FLASH EEPROM in each completed semiconductor storage device is solely tested (function test and characteristic test). At step S3, non-defective products are selected. At step S4, a function test is performed on an SRAM included in each semiconductor storage device. At step S5, products which normally operate are selected. At step S6, a test for characteristics of the SRAM, such as the operation speed and the like, is performed.

Timing information for adjusting the internal operation timing of the SRAM obtained based on results of the characteristic test, such as the access time for the SRAM, etc., is written in the FLASH cell of the FLASH EEPROM by a tester in a manner as described above (step S7). Thereafter, referring to FIG. 3, the information written in the FLASH cell of the FLASH EEPROM is output through the bonding pad BPAD and transmitted to the ATD pulse generation circuit ATDPG of the SRAM through the bonding wire. As a result, the internal timing of the SRAM is automatically adjusted to a desired timing.

Then, at step S8, a final test is performed (at least with respect to the SRAM) for confirming whether the semiconductor storage device operates as per the adjusted specifications. At step S9, products which operate normally are selected and shipped as products for sale.

In some cases, specifications to be determined, such as the operation supply voltage, the bit width at which data can be input/output at one time, etc., are previously determined according to demands of a user, etc., before the shipment of product for sale. In such a case, evaluation of the semiconductor storage device of the present invention is performed through a process shown in FIG. 8. At step S1, assemblage of the semiconductor storage devices are completed. At step S2, a specification (in this example, a specification for the operation supply voltage) is determined according to demands of a user, etc. At step S3, the FLASH EEPROM in each completed semiconductor storage device is solely tested (function test and characteristic test). At step S4, non-defective products are selected. At step S5, the SRAM in each completed semiconductor storage device is solely tested (function test and characteristic test). At step S6, products which normally operate are selected.

Thereafter, at step 7, the semiconductor storage devices selected at step S6 are divided based on the predetermined specifications (in this case, the operation supply voltage of 5 V and 3.3 V). At steps S8a and S8b, specific information is written in the FLASH cell in the FLASH EEPROM. In this example, at step S8a, a high signal ("1") is written in the FLASH cell so as to adjust the semiconductor storage device to the 5 V specification. At step S8b, a low signal ("0") is written in the FLASH cell so as to adjust the semiconductor storage device to the 3.3 V specification. Thereafter, as described above with reference to FIG. 3, the information written in the FLASH cell of the FLASH EEPROM is output through the bonding pad BPAD and transmitted to the ATD pulse generation circuit ATDPG of the SRAM through the bonding wire. As a result, the specification of the SRAM is determined according to the information.

Then, at step S9, a final test is performed (at least with respect to the SRAM) for confirming whether the semiconductor storage device operates as per the determined specification. At step S10, products which normally operate are selected and shipped as products for sale.

Hereinabove, the present invention has been specifically described by illustrating an embodiment thereof with reference to the drawings. However, the present invention is not limited to the above embodiment. It is needless to say that various modifications can be made without departing from the scope of the present invention. For example, in the above example, semiconductor storage devices based on different supply voltage specifications of 5 V and 3.3 V are produced from a same chip design. However, the present invention is not limited to such a specific case, but can be applied to a case where semiconductor storage devices based on different lower supply voltage specifications are produced from a same chip design so as to be used with a product which operates at a lower supply voltage.

Furthermore, as well as the change in supply voltage specification, changes in various functional specifications of the semiconductor storage device, such as the input/output bit width (e.g., 4 bits and 16 bits), etc., can be achieved in substantially the same manner as that described in the above embodiment.

Furthermore, in the above embodiment, the present invention is applied to a semiconductor storage device including an SRAM, but can also be applied to a semiconductor storage device including other type of volatile semiconductor memory, such as a DRAM or the like. Further still, as a non-volatile semiconductor memory, an ordinary EEPROM, FRAM, or the like, can be employed as well as the FLASH EEPROM.

As described hereinabove in detail, according to the present invention, a malfunction of a device which is caused when a line of device products based on different specifications are produced from a single circuit configuration, or which is caused due to a variation in characteristics of elements constituting the device which occurs during the fabrication process, can be eliminated by an adjustment step provided in the first or second half of the fabrication process or provided after the fabrication process wherein the adjustment step is achieved by writing specific information (signal) in a non-volatile semiconductor memory in the semiconductor storage device, such as a FLASH EEPROM. Furthermore, according to the present invention, a stock step in the manufacturing (production adjustment) can be performed after the fabrication process is completed. As a result, the number of defective products which may be generated in the first and second half of the fabrication process can be reduced.

According to the present invention, since it is not necessary to disconnect a trimming fuse with a laser beam, there is no possibility that an unsuccessful disconnection of a trimming fuse is caused. Similarly, an unsuccessful bonding can be avoided. Furthermore, since the adjustment step of the present invention is performed by writing specific information in a non-volatile semiconductor memory, such as a FLASH EEPROM, the adjustment step can be performed again after characteristics has been evaluated. Further still, according to the present invention, fabrication of products for sale can be started at an earlier stage in the entire manufacturing process as compared with a conventional manufacturing process, and accordingly, a period required for experimental production and a period required for evaluation of a product can be shortened.

In the case where various types of devices are produced from a same chip design, if a deviation of the internal timing of the device is expected before fabrication, a pulse width adjustment signal may be associated with a signal for changing the device type (specification), whereby concurrently with the switching of the device type, the pulse width can be adjusted so as to be optimum for a selected device type.

According to the present invention, even after the quantity of production has been increased, it is possible to quickly satisfy demands of customers because a stock step for products is performed only for finished products after the fabrication process has been completed.

Various other modifications will be apparent to and can be readily made by those skilled in the art without departing from the scope and spirit of this invention. Accordingly, it is not intended that the scope of the claims appended hereto be limited to the description as set forth herein, but rather that the claims be broadly construed.

What is claimed is:

1. A semiconductor storage device comprising a rewritable non-volatile semiconductor memory and a volatile semiconductor memory, the non-volatile semiconductor memory including:
   a memory area for storing timing information for adjusting a timing of an internal operation of the volatile semiconductor memory for changing the device type of the semiconductor storage device; and
   an output circuit for outputting the timing information stored in the memory area to the volatile semiconductor memory to change the device type,
   wherein the volatile semiconductor memory adjusts the timing of the internal operation of the volatile semiconductor memory based on the timing information.

2. A semiconductor storage device according to claim 1, wherein:
   the volatile semiconductor memory includes a synchronization signal generation circuit for generating a synchronization signal based on the timing information; and
   the volatile semiconductor memory operates in synchronization with the synchronization signal.

3. A semiconductor storage device comprising a rewritable non-volatile semiconductor memory and a volatile semiconductor memory, the non-volatile semiconductor memory including:
   a memory area for storing specification information for specifying a specification of the volatile semiconductor memory for changing the device type of the semiconductor storage device; and
   an output circuit for outputting the specification information stored in the memory area to the volatile semiconductor memory to change the device type,
   wherein the volatile semiconductor memory changes the specification of the volatile semiconductor memory based on the specification information.

4. A semiconductor storage device according to claim 3, wherein:
   the non-volatile semiconductor memory further includes another memory area for storing timing information for adjusting a timing of an internal operation of the volatile semiconductor memory;
   the output circuit outputs the timing information stored in the another memory area to the volatile semiconductor memory; and
   the volatile semiconductor memory adjusts the timing of the internal operation of the volatile semiconductor memory based on the timing information.

5. A semiconductor storage device according to claim 4, wherein:
   the volatile semiconductor memory includes a synchronization signal generation circuit for generating a synchronization signal based on the timing information; and
   the volatile semiconductor memory operates in synchronization with the synchronization signal.

6. A semiconductor storage device according to claim 3, wherein the specification of the volatile semiconductor memory includes a specification as to a bit width of data to be read out from the volatile semiconductor memory.

7. A semiconductor storage device according to claim 3, wherein the specification of the volatile semiconductor memory includes a specification as to an operating voltage for operating the volatile semiconductor memory.

8. A semiconductor storage device according to claim 3, wherein the volatile semiconductor memory controls an amount of delay in a read timing signal for reading data from the volatile semiconductor memory based on the specification information.

9. A method for evaluating a semiconductor storage device comprising a rewritable non-volatile semiconductor memory and a volatile semiconductor memory, wherein:
   the non-volatile semiconductor memory and the volatile semiconductor memory are enclosed in a same package;
   the non-volatile semiconductor memory includes
      a memory area for storing timing information for adjusting a timing of an internal operation of the volatile semiconductor memory for changing the device type of the semiconductor storage device, and
      an output circuit for outputting the timing information stored in the memory area to the volatile semiconductor memory to change the device type; and
   the volatile semiconductor memory adjusts the timing of the internal operation of the volatile semiconductor memory based on the timing information; and
   the method for evaluating a semiconductor storage device includes steps of
      evaluating a characteristic of the volatile semiconductor memory,
      writing the timing information in the memory area to change the device type, and
      reevaluating the characteristic of the volatile semiconductor memory.

10. A method for evaluating a semiconductor storage device comprising a rewritable non-volatile semiconductor memory and a volatile semiconductor memory, wherein:
   the non-volatile semiconductor memory and the volatile semiconductor memory are enclosed in a same package;
   the non-volatile semiconductor memory includes
      a memory area for storing specification information for specifying a specification of the volatile semiconductor memory for changing the device type of the semiconductor storage device, and an output circuit for outputting the specification information stored in the memory area to the volatile semiconductor memory to change the device type; and the volatile semiconductor memory changes the specification of the volatile semiconductor memory based on the specification information; and the method for evaluating a semiconductor storage device includes steps of evaluating a characteristic of the volatile semiconductor memory, writing the specification information in the memory area to change the device type, and reevaluating the characteristic of the volatile semiconductor memory.

11. A method for evaluating a semiconductor storage device according to claim 10, wherein:

the non-volatile semiconductor memory further includes another memory area for storing timing information for adjusting a timing of an internal operation of the volatile semiconductor memory; and the method for evaluating a semiconductor storage device further includes a step of writing the timing information in the another memory area.

* * * * *